United States Patent
Kim et al.

(10) Patent No.: US 9,330,966 B2
(45) Date of Patent: May 3, 2016

(54) METHODS OF FORMING SEMICONDUCTOR DEVICES

(75) Inventors: Sun-Young Kim, Yongin-si (KR);
Jun-Eui Song, Yongin-si (KR);
Tae-Wan Lim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 932 days.

(21) Appl. No.: 13/313,172

(22) Filed: Dec. 7, 2011

(65) Prior Publication Data

US 2012/0164831 A1    Jun. 28, 2012

(30) Foreign Application Priority Data

Dec. 27, 2010   (KR) ........................ 10-2010-0135146

(51) Int. Cl.
*H01L 21/4763* (2006.01)
*H01L 21/768* (2006.01)
*H01L 27/115* (2006.01)

(52) U.S. Cl.
CPC .... *H01L 21/76807* (2013.01); *H01L 21/76831* (2013.01); *H01L 27/11521* (2013.01); *H01L 2221/1031* (2013.01)

(58) Field of Classification Search
USPC ................................................ 438/675, 430
See application file for complete search history.

(56) References Cited

U.S. PATENT DOCUMENTS

| | | | |
|---|---|---|---|
| 6,413,852 B1* | 7/2002 | Grill et al. | 438/619 |
| 8,163,655 B2* | 4/2012 | Chang | 438/751 |
| 2003/0060037 A1* | 3/2003 | Wu | 438/637 |
| 2004/0198057 A1* | 10/2004 | Huang et al. | 438/694 |
| 2004/0222182 A1* | 11/2004 | Perng et al. | 216/13 |
| 2005/0017295 A1* | 1/2005 | Kim | H01L 21/76804 257/332 |
| 2005/0153572 A1* | 7/2005 | Cho et al. | 438/778 |
| 2005/0161431 A1* | 7/2005 | Lee | B81C 99/009 216/54 |
| 2006/0105558 A1* | 5/2006 | Chuang et al. | 438/597 |
| 2006/0270215 A1* | 11/2006 | Lee | H01L 21/28525 438/637 |
| 2007/0170433 A1* | 7/2007 | Son et al. | 257/67 |
| 2008/0122076 A1* | 5/2008 | Hong et al. | 257/734 |
| 2009/0174039 A1* | 7/2009 | Lee | H01L 29/42376 257/622 |
| 2010/0127398 A1* | 5/2010 | Kim et al. | 257/773 |
| 2010/0279494 A1* | 11/2010 | Wang | H01L 31/18 438/478 |

(Continued)

FOREIGN PATENT DOCUMENTS

| KR | 1020020019286 | 3/2002 |
|---|---|---|
| KR | 20050108141 | * 11/2005 |

(Continued)

OTHER PUBLICATIONS

Stanley Wolf, PhD., Excerpt from "Silicon Processing for the VLSI ERA, 15.4 Introduction to Dual-Damascene Interconnect Processes", vol. 4, pp. 674-679; http://www.latticepress.com/damascene.html.

*Primary Examiner* — Marc Armand
*Assistant Examiner* — Wilner Jean Baptiste
(74) *Attorney, Agent, or Firm* — Myers Bigel & Sibley, P.A.

(57) ABSTRACT

Methods of forming a semiconductor device are provided. The methods may include forming a second insulation pattern on a first insulation pattern. The first insulation pattern may cover a plurality of conductive structures, and may include a hole therein. The second insulation pattern may include a trench therein that is connected with the hole. The methods may also include forming a spacer on sidewalls of the hole and the trench. The methods may further include forming a wiring structure in the hole and the trench.

7 Claims, 10 Drawing Sheets

(56) References Cited

U.S. PATENT DOCUMENTS

2011/0092060 A1* 4/2011 Lee .................. H01L 21/76831
 438/586
2011/0151667 A1* 6/2011 Hwang et al. ................. 438/667
2011/0210447 A1* 9/2011 Seidel et al. .................. 257/774

FOREIGN PATENT DOCUMENTS

| KR | 1020050108141 | | 11/2005 |
| KR | 1020060076685 | | 7/2006 |
| KR | 1020090044582 | | 5/2009 |
| KR | 20090044582 | * | 7/2009 |

* cited by examiner

METHODS OF FORMING SEMICONDUCTOR DEVICES

CROSS-REFERENCE TO RELATED APPLICATIONS

This application claims priority under 35 U.S.C. §119 to Korean Patent Application No. 10-2010-0135146, filed on Dec. 27, 2010, the disclosure of which is hereby incorporated by reference in its entirety.

BACKGROUND

The present disclosure relates to semiconductor devices and methods of forming the same.

As the degree of integration of integrated circuit devices increases, wiring structures may be downsized and/or become more dense. In addition, as the critical dimension (CD) of semiconductor devices decreases, the gap distance between neighboring wiring structures may also decrease.

Some semiconductor devices have included stacked structures so as to increase the degree of integration. Conductive structures, such as a transistor, are formed on a semiconductor device, such as a wafer, and an insulation interlayer is formed on the substrate to a sufficient thickness to cover the conductive structures. Wiring structures are formed on the insulation interlayer and are electrically connected to the conductive structures underlying the insulation interlayer. Thus, the wiring structures may include a conductive interconnection penetrating through the insulation interlayer and making contact with the conductive structures, and a metal wiring making contact with the conductive interconnection and transferring external signals to the conductive structures.

The wiring structure may be formed through a photolithography process for forming an opening in an insulation layer and a deposition process for forming the interconnection and the metal wiring in the opening. Recently, wiring structures have been downsized as the reduction of critical dimension and the aspect ratio of the opening has rapidly increased. Thus, void and seam defects have been frequently detected in the photolithography process, and neighboring wirings have been easily brought into contact with each other to thereby generate bridge defects and electric shorts.

For the above reasons, some interconnections have been firstly formed in the opening and an additional insulation layer has been formed on the interconnection in such a way that the interconnection is exposed through a trench. Thereafter, a conductive metal is deposited onto the insulation layer to fill up the trench, thereby forming the metal wiring making contact with the interconnection in the trench.

In such a case, a planarization process has been used in an attempt to improve the reliability of the wiring structure. For example, an insulation interlayer may be formed on an underlying structure in such a way that the underlying structure is exposed through the via-hole. Then, a conductive layer may be formed on the insulation interlayer to a sufficient thickness to fill up the via-hole, and an upper portion of the conductive layer is removed by a planarization process until a top surface of the insulation interlayer is exposed. Therefore, the conductive layer remains in the via-hole of the insulation interlayer to thereby form the interconnection.

In the above process for forming the interconnection, residuals of the conductive layer on the insulation interlayer due to insufficient planarization may have various process defects. For example, a barrier layer and the conductive metal layer filling up the via-hole may have a different polishing resistance. Accordingly, the conductive layer and the barrier layer may be removed from the insulation interlayer at different rates in the planarization process, and thus the barrier layer may locally remain on the insulation interlayer.

Moreover, as the gap distance between wirings gradually decreases with the increased of degree of integration in semiconductor devices, residuals of the barrier layer have frequently caused electric connections between the interconnection and a neighboring wiring, as well as the wiring respective to the interconnection, to thereby generate bridge failures between neighboring wirings.

In addition, an upper surface of the interconnection may be non-uniform due to hydrogen peroxide ($H_2O_2$) in polishing slurry. When the conductive layer and the barrier layer are removed by a chemical mechanical polishing (CMP) process, the conductive layer is locally melted by the hydrogen peroxide ($H_2O_2$) in the polishing slurry, and thus the upper surface of the interconnection is partially melted after the CMP process. Non-uniformity of the surface of the interconnection may deteriorate the contact quality of the interconnection and the wiring, thereby decreasing the reliability of the wiring structure. Also, sufficient removal of the residuals of the barrier layer from the insulation interlayer can take a significant amount of the polishing time and the increase in the polishing time may cause a larger melted area of the upper surface of the interconnection due to the hydrogen peroxide ($H_2O_2$), thereby deteriorating the contact stability between the interconnection and the wiring.

SUMMARY

According to some embodiments, methods of forming a semiconductor device may include forming a first insulation pattern on a substrate to cover a plurality of conductive structures thereon, the first insulation pattern including a penetration-hole therein through which a contact area of the substrate is exposed. The methods may also include forming a second insulation pattern on the first insulation pattern, the second insulation pattern including a trench therein that is connected with the penetration-hole and shaped into a line extending in a first direction. The methods may further include forming a spacer on sidewalls of the penetration-hole and the trench. The methods may additionally include forming a wiring structure in the penetration-hole and the trench extending in the first direction, the wiring structure including an interconnection that fills the penetration-hole and a conductive line that fills the trench in the first direction and is integrally connected to the interconnection in a body.

In some embodiments, forming the second insulation pattern may include forming a sacrificial pattern filling the penetration-hole in the first insulation pattern. Forming the second insulation pattern may also include forming a second insulation layer on the sacrificial pattern and the first insulation pattern. Forming the second insulation pattern may further include forming the trench in the second insulation layer exposing the sacrificial pattern and extending in the first direction.

Some embodiments provide that forming the sacrificial pattern includes forming a sacrificial layer on the first insulation pattern to fill the penetration-hole, and removing an upper portion of the sacrificial layer by performing a planarization process until an upper surface of the first insulation pattern is exposed.

In some embodiments, the sacrificial layer may include a spin-on hard mask layer including carbon (C)-based material.

Some embodiments provide that forming the spacer includes removing the sacrificial pattern from the penetration-hole to connect the trench with the penetration-hole and expose the contact area. Forming the spacer may also include forming a spacer layer on sidewalls and a bottom of the penetration-hole, on sidewalls of the trench, and on an upper surface of the second insulation pattern. Forming the spacer may further include partially removing the spacer layer from the bottom of the penetration-hole and from the upper surface of the second insulation pattern, such that the spacer layer remains on the sidewalls of the penetration-hole and the trench.

In some embodiments, removing the sacrificial pattern may be performed by a wet etching process.

Some embodiments provide that the wet etching process may be performed by an etchant including ammonia.

In some embodiments, forming the spacer layer may be performed by one of a plasma enhanced chemical vapor deposition (PECVD) process and an atomic layer deposition (ALD) process.

Some embodiments provide that the second insulation pattern may include tetraethyl orthosilicate (TEOS) deposited by the plasma enhanced chemical vapor deposition (PECVD) process. Also, the spacer layer may include one of silicon nitride, silicon oxide, and silicon oxynitride.

In some embodiments, partially removing the spacer layer may be performed by an isotropic etching process.

According to some embodiments, methods of forming a semiconductor device may include forming a sacrificial pattern in a hole within a first insulation pattern that is on a plurality of conductive structures. The methods may also include forming a second insulation pattern on the first insulation pattern and the sacrificial pattern therein, the second insulation pattern including a trench therein that exposes a surface of the sacrificial pattern. The methods may further include removing the sacrificial pattern from the first insulation pattern. The methods may additionally include forming a spacer on sidewalls of the hole and the trench. The methods may also include forming a wiring structure between opposing sidewalls of the spacer in the hole and the trench.

In some embodiments, removing the sacrificial pattern from the first insulation pattern may expose a surface of a drain electrode. Also, the wiring structure may directly contact the drain electrode.

Some embodiments provide that forming the sacrificial pattern may include forming a sacrificial layer on the first insulation pattern to substantially fill the hole. Forming the sacrificial pattern may also include removing an upper portion of the sacrificial layer by performing a planarization process until an upper surface of the first insulation pattern is exposed.

According to some embodiments, semiconductor devices may include a substrate including a plurality of conductive structures. The devices may also include a first insulation pattern on the substrate and covering the conductive structures, the first insulation pattern including a penetration-hole therein connected to a contact area of the substrate. The devices may further include a second insulation pattern on the first insulation pattern, the second insulation pattern including a trench that is connected with the penetration-hole and shaped into a line extending in a first direction. The devices may additionally include a spacer on sidewalls of the penetration-hole and the trench. The devices may also include a wiring structure in the penetration-hole and the trench and extending in the first direction, the wiring structure including an interconnection in the penetration-hole and a conductive line in the trench along the first direction and integrally connected to the interconnection in a body.

In some embodiments, the second insulation pattern may include an etch stop pattern and an inter-metal dielectric (IMD) pattern on the etch stop pattern.

Some embodiments provide that the first insulation pattern and the spacer may include at least one of silicon nitride, silicon oxide, and silicon oxynitride, and that the IMD pattern may include tetra-ethyl ortho-silicate (TEOS) deposited by a plasma enhanced chemical vapor deposition (PECVD) process.

In some embodiments, the substrate may include an active region extending in the first direction and a device isolation layer defining the active region. Additionally, each of the conductive structures may include a stack gate structure on the active region, source and drain electrodes on the active region at both sides of the stack gate structure, a word line directly contacting the stack gate structure and extending in a second direction perpendicular to the first direction, and a common source line between a pair of neighboring word lines and extending in the second direction across the source electrode and the device isolation layer adjacent the source electrode.

Some embodiments provide that the interconnection may include a plurality of drain contact plugs arranged in series along the first direction and directly contacting the drain electrodes and a plurality of source contact plugs arranged in series along the first direction and directly contacting the common source lines. Also, the conductive line may include a plurality of bit lines each of which is simultaneously connected to the plurality of drain contact plugs along the first direction and a plurality of source lines each of which is simultaneously connected to the source contact plugs along the first direction.

In some embodiments, the drain contact plugs may be arranged into a matrix shape in the first and the second directions. Additionally, the bit lines, each of which extends in the first direction, may be spaced apart by a gap distance in the second direction.

Some embodiments provide that the stack gate structure may include a tunnel insulation layer, a floating gate, an inter-gate dielectric layer, and a control gate that are sequentially stacked on the active region of the substrate.

BRIEF DESCRIPTION OF THE DRAWINGS

The above and other features and advantages of the disclosure will become more apparent by describing in detail example embodiments thereof with reference to the attached drawings in which:

FIGS. 4A to 4I are cross-sectional views illustrating a method of manufacturing the semiconductor device shown in FIGS. 1A and 1B according to some embodiments.

DETAILED DESCRIPTION

Figure 1A:
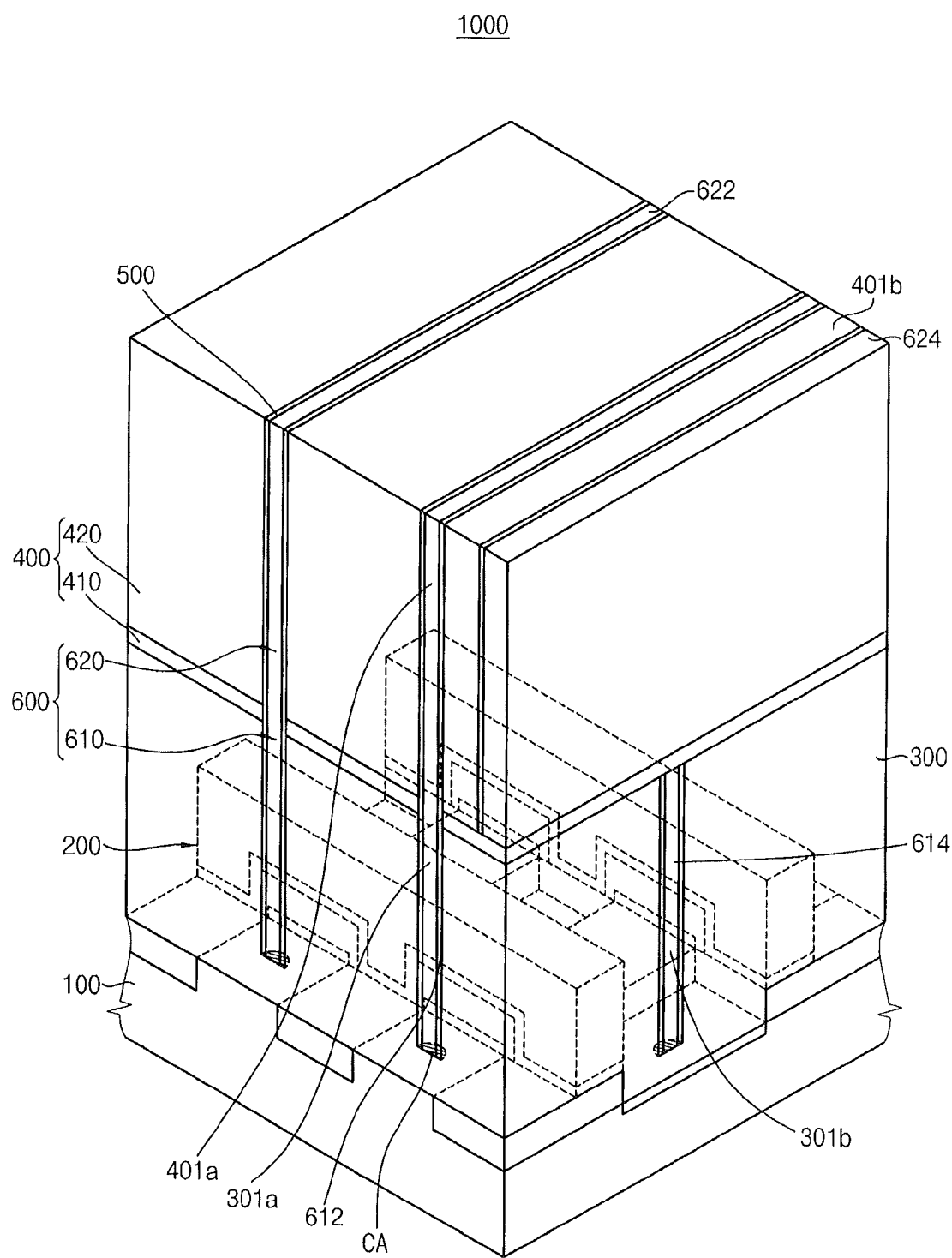
FIG. 1A is a perspective view illustrating a semiconductor device in accordance with an some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
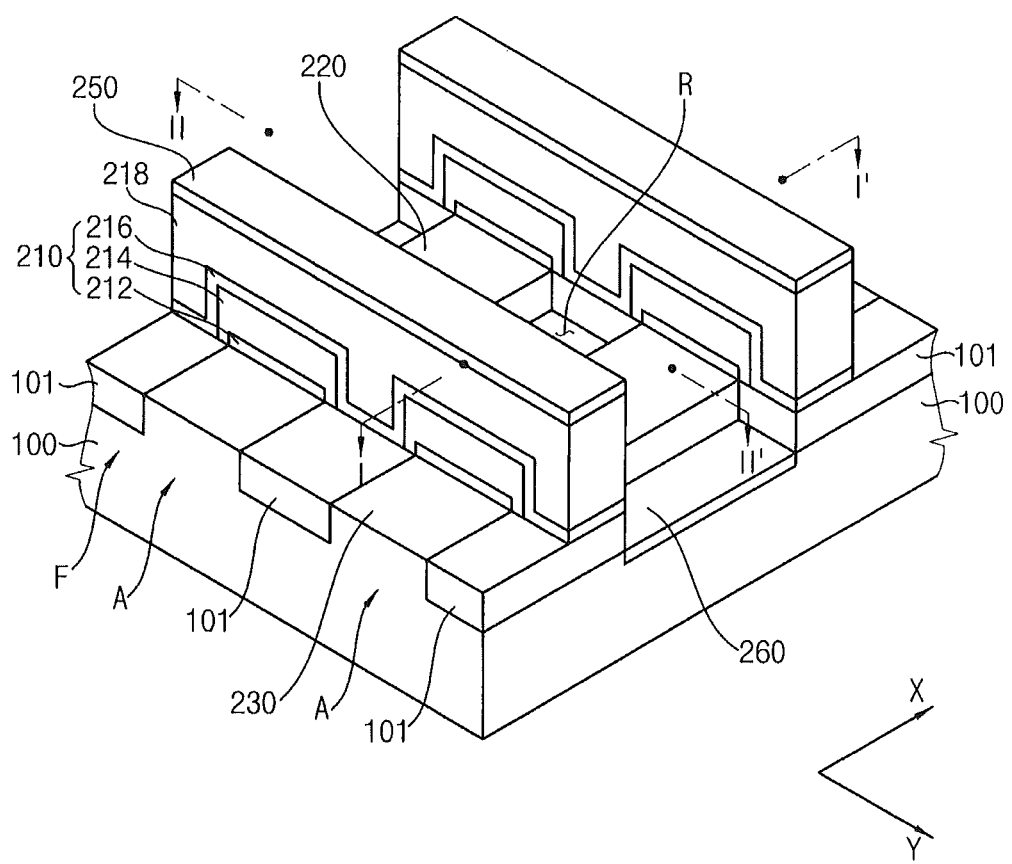
FIG. 1B is a perspective view illustrating a memory cell of the semiconductor device shown in FIG. 1A according to some embodiments.
Figure 2A:
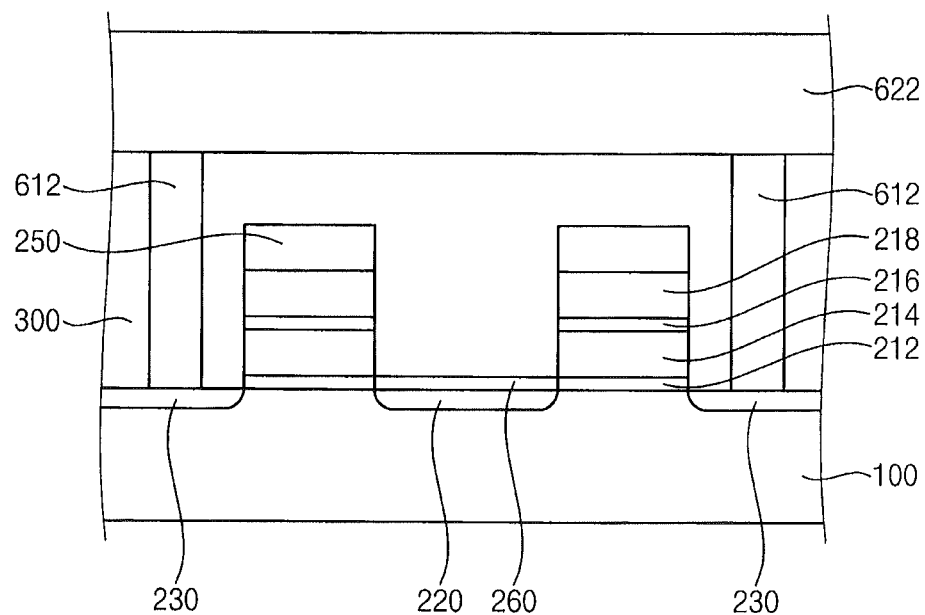
FIG. 2A is a cross-sectional view cut along a line I-I' of FIG. 1B according to some embodiments.
Figure 2B:
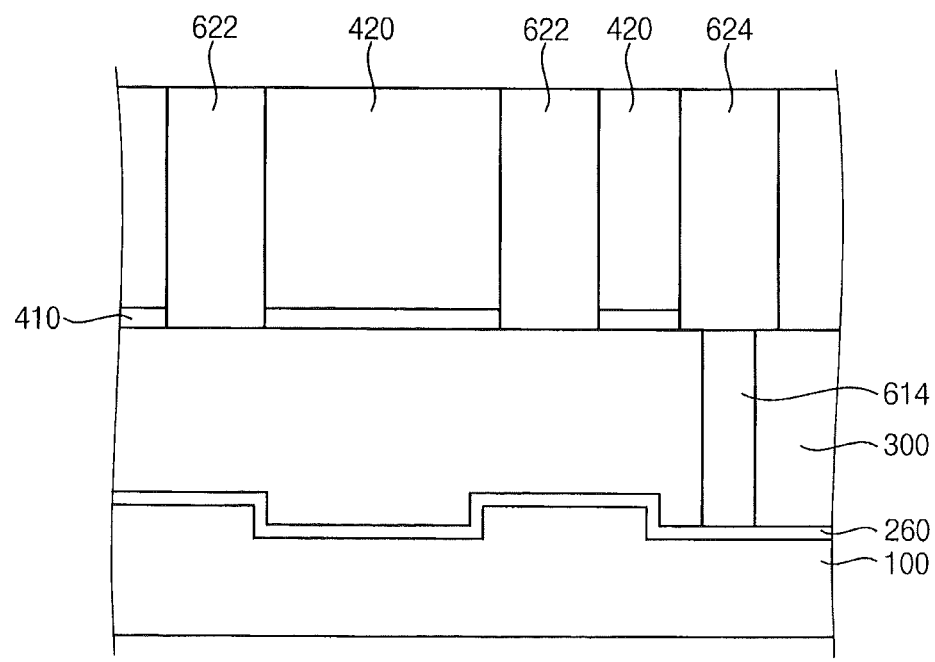
FIG. 2B is a cross-sectional view cut along a line II-II' of FIG. 1B according to some embodiments.
Figure 3:
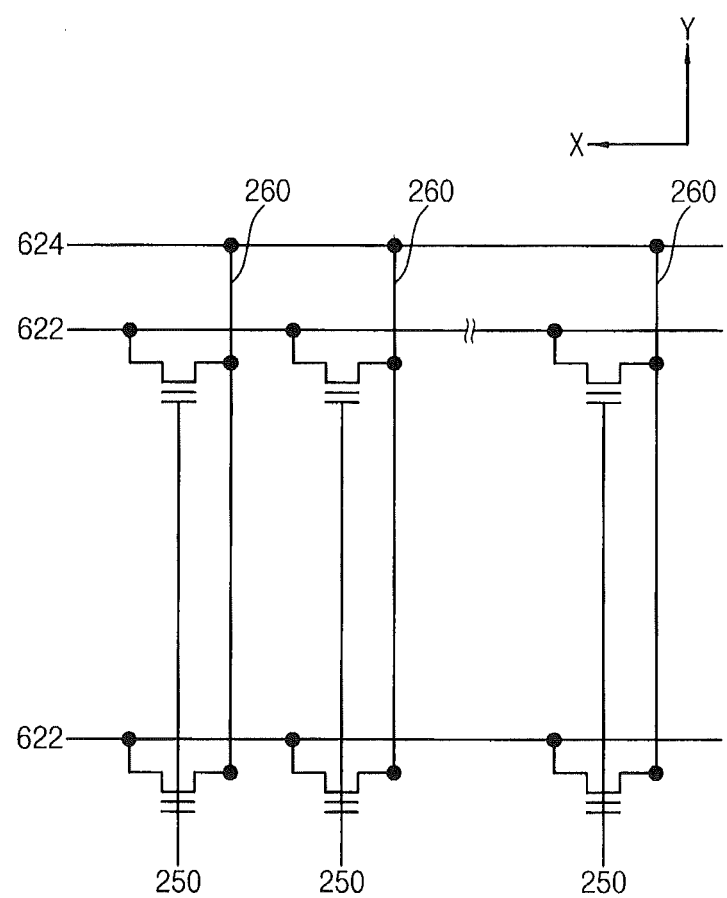
FIG. 3 is a circuit diagram of the semiconductor device shown in FIG. 1A according to some embodiments.

FIG. 1A is a perspective view illustrating a semiconductor device in accordance with some embodiments. FIG. 1B is a perspective view illustrating a memory cell of the semiconductor device shown in FIG. 1A according to some embodiments. FIG. 2A is a cross-sectional view cut along a line I-I' of FIG. 1B and FIG. 2B is a cross-sectional view cut along a line II-IF of FIG. 1B. FIG. 3 is a circuit diagram of the semiconductor device shown in FIG. 1A according to some embodiments.

Referring to FIGS. 1A to 3, a semiconductor device 1000 in accordance with some embodiments may include a semiconductor substrate 100 including a plurality of conductive structures 200 (e.g., transistors), a first insulation pattern 300 covering the conductive structures 200 and having an penetration-hole 301 through which a contact area CA of the substrate 100 is exposed, a second insulation pattern 400 positioned on the first insulation pattern 300 and having a trench (e.g., a line-shaped trench) 401 that may be connected/continuous with the penetration-hole 301 and may extend in a direction of a wiring, a spacer 500 positioned on sidewalls of the penetration-hole 301 and the trench 401 and on a wiring structure 600 in the penetration-hole 301 and the trench 401. The wiring structure 600 may include an interconnection 610 filling up the penetration-hole 301 (e.g., filling the penetration-hole 301 up to where it meets the trench 401) and a metal wiring 620 filling up the trench 401.

The substrate 100 may include a semiconductor substrate, such as a wafer, and may be divided into an active region A and a field region F defining the active region A. The conductive structures 200 may be arranged on the active region A, and a device isolation layer 101 may be arranged on the field region F. The neighboring conductive structures may be electrically isolated from each other by the device isolation layer 101. The contact area CA may be positioned on a portion of the active region A.

For example, as illustrated in FIG. 1B, the active region A may be shaped into a line extending in a first direction x and a plurality of gate structures 210 for a transistor may be arranged on the active region A of the substrate 100 at a predetermined gap distance. Source and drain electrodes 220 and 230, respectively, for the transistor may be arranged on the active region A at both sides of the gate structure 210.

The conductive structures 200 may include a transistor, a capacitor, and a contact pad for a volatile memory device such as a dynamic random access memory (DRAM) device and a transistor for a non-volatile memory device such as a flash memory device. In addition, the conductive structure 200 may include a lower structure of a multilayered wiring structure for transferring signals to the transistor.

For example, the conductive structure 200 may include a stack gate structure 210 of the NOR flash memory device, source and drain electrodes 220 and 230 adjacent the stack gate structure 210, a word line 250 making contact with the stack gate structure 210 and extending in the first direction, and a common source line (CSL) 260 applying a source signal to the source electrode 220.

The stack gate structure 210 may include a tunnel insulation layer 212, a floating gate 214, an inter-gate dielectric layer 216, and a control gate 218 that may be sequentially stacked on the active region A of the substrate 100. Charges may be stored into or discharged from the floating gate 214 through the tunnel insulation layer 212 in accordance with the signal applied to the control gate 218, and thus electrical data may be stored into or erased from the memory cell including the stacked gate structure 210. The source and the drain electrodes 220 and 230 may be arranged at both sides of the stack gate structure 210 along the first direction and may be commonly used by the stack gate structures 210 adjacent each other, respectively.

For example, the tunnel insulation layer 212 may include a silicon oxide layer that may be formed on the substrate 100 by a thermal oxidation process, and the floating gate electrode 214 may include a polysilicon layer. The inter-gate dielectric layer 216 may include a multilayer such as an oxide-nitride-oxide (ONO) layer in which a first oxide layer, a nitride layer, and a second oxide layer may be sequentially stacked. The control gate electrode 218 may comprise polysilicon and metal silicide.

As illustrated in FIG. 1B, the inter-gate dielectric layer 216 and the control gate 218 may be shaped into a line extending in the second direction y substantially perpendicular to the first direction x. Thus, the stack gate structures 210 arranged in the second direction y may be connected to one another in series along the second direction y, thereby forming the gate line extending in the second direction y. Particularly, low-resistive metal materials may be deposited onto the control gate 218, thereby forming the word line 250, through which gate signals may be applied to the control gate 218. Thus, the gate signals may be simultaneously applied to a plurality of stack gate structures 210 connected to the word line 250 along the second direction y.

Impurities may be implanted onto the active region A of the substrate adjacent the stack gate structures 210, thereby forming the source and drain electrodes 220 and 230 at both sides of the stack gate structure 210 that may be opposite to each other with respect to the stack gate structure 210 in the first direction x. The neighboring stack gate structures 210 may share the source and drain electrodes 220 and 230. Thus, a first stack gate structure may share the source electrode 220 together with a second stack gate structure at a right-hand side of the first stack gate structure and may also share the drain electrode 230 together with a third stack gate structure at a left-hand side of the first stack gate structure.

Particularly, referring to FIG. 1B, the device isolation layer 101 close to the source electrode 220 may be removed from the field region F of the substrate 100 and thus a recess R may be provided between a pair of the source electrodes 220. Thus, the source electrodes 220 may be spaced apart from each other by the width of the field region F due to the recess R. A conductive layer having a low-resistive metal may be formed on the sidewalls and bottoms of the recesses and upper surfaces of the source electrodes 220, thereby forming the common source line (CSL) 260 extending in the second direction y. Thus, a plurality of the source electrodes 220 are connected to the common source line 260 in series along the second direction y.

Referring to FIG. 2B, the CSL 260 may be electrically connected to an overriding source line through a source interconnector 614 and thus the same signals may be applied to a plurality of the source electrodes 220 making contact with the same CSL 260. Referring to FIG. 2A, the drain electrodes 230 may be electrically connected to an overriding bit line 622 through a drain interconnector 612. The same bit line signal may be applied to a plurality of the drain electrodes 230 of the memory cell that may be arranged in series on the same active regions A along the first direction x. Accordingly, the same drain signal may be applied through the bit line 622 to all the drain electrodes 230 of the memory cells that may be arranged on the same active regions A in the first direction x, and the same source signals may be applied through the CSL 260 to all the source electrodes 220 of the memory cells that may be arranged across the active regions in the second direction y.

The first and the second insulation patterns 300 and 400 may be stacked on the substrate 100 in such a manner that the stack gate structure 210, the source electrode 220, the drain electrode 230, the word line 250, and the conductive structure 200 may be covered with the first and second insulation patterns 300 and 400.

For example, the first insulation pattern 300 may have a sufficient thickness to cover the conductive structure 200 on the substrate 100, and may have a substantially flat upper surface. Therefore, a plurality of the word lines 250 and a plurality of the CSLs 260 may be electrically insulated from one another. In some embodiments, the first insulation pattern 200 may comprise any one of silicon nitride, silicon oxide, silicon oxynitride, and compositions thereof.

The first insulation pattern 300 may include a plurality of penetration-holes 301 through which the drain electrodes 230 and the CSLs 260 may be partially exposed. Thus, most (e.g., a majority) of each of the conductive structures 200 may be covered with the first insulation pattern 300, and a minority portion of each of the conductive structures 200 may be exposed through the penetration-holes 301. Accordingly, each exposed portion of the conductive structure 200 through the penetration-hole 301 may function as a contact area CA of the conductive structure 200. The penetration-holes 301 may include a drain penetration-hole 301a through which the drain electrode 230 may be exposed and a source penetration-hole 301b through which the CSL 260 may be exposed.

The second insulation pattern 400 may be positioned on the first insulation pattern 300 and may include a trench 401 that is connected/continuous with the penetration-hole 301. The wiring structures 600 may contact (e.g., directly contact) the conductive structures 200 through the penetration-holes 301 and the trenches 401, and may be electrically insulated from each other by the first and second insulation patterns 300 and 400.

For example, the trench 401 may be shaped into a line extending in the first direction x, and a plurality of the penetration-holes 301 that are arranged in series along the first direction x may be connected/continuous with the same trench 401. The trench 401 and the penetration-hole 301 may together function as a wiring space. Thus, the trench 401 may include a drain trench 401a that is connected/continuous with the drain penetration-hole 301a and a source trench 401b that is connected/continuous with the source penetration-hole 301b.

A plurality of the drain penetration-holes 301a may be arranged as a matrix shape on the substrate 100, and a plurality of the line-shaped drain trenches 401a, which may extend in the first direction x, may be spaced apart by a gap distance in the second direction y. Thus, the drain penetration-holes 301a arranged in series in the first direction x may be connected/continuous with the same drain trench 401a, and the drain penetration-holes 301a arranged in series in the second direction y may be connected/continuous with different drain trenches 401a. That is, the number of the drain trenches 401a extending in the first direction x may be substantially the same as that of the drain penetration-holes 301a that may be arranged in series along the second direction y.

A single source penetration-hole 301b may be arranged at every CSL 260. A pair of the word lines may share a single CSL 260, and thus the source penetration-hole 301b may be provided at every pair of the word lines in such a manner that a plurality of the source penetration-holes 301b may be arranged in series along the first direction x. Accordingly, a series of the source penetration-holes 301b may be connected/continuous with the same source trench 401b extending in the first direction x, and thus the source trench 401b may be parallel with the drain trench 401a in the first direction x. In some embodiments, the source trench 401b may be positioned at every memory block at a memory cell area of the semiconductor device 1000.

Accordingly, each drain electrode 230 of the memory cells of the semiconductor device 1000 may be exposed through the drain penetration-hole 301a of the first insulation pattern 300, and the drain trench 401a of the second insulation pattern 400 and each CSL 260 of the semiconductor device 1000 may be exposed through the source penetration-hole 301b of the insulation pattern 300 and the source trench 401b of the second insulation pattern 400.

In some embodiments, the second insulation pattern 400 may include an inter-metal dielectric (IMD) pattern 420 and an etch stop pattern 410 interposed between the IMD pattern 420 and the first insulation pattern 300. The IMD pattern 420 may include a plasma-enhanced tetraethyl orthosilicate (PE-TEOS) layer that may comprise tetraethyl orthosilicate (TEOS) deposited by a plasma-enhanced chemical vapor deposition (PECVD) process. The etch stop pattern 410 may have an etching selectivity with respect to the IMD pattern 420.

The spacer 500 may be arranged on the bottoms and the sidewalls of the penetration-holes 301, and on the sidewalls of the trenches 401, and may comprise insulation materials such as silicon nitride, silicon oxide, and silicon oxynitride. The wiring structure 600 may be enclosed with the spacer 500 in the penetration-hole 301 and the trench 401. Thus, neighboring wiring structures 600 may be electrically insulated by the spacer 500, as well as by the first and the second insulation patterns 300 and 400, thereby reducing/minimizing signal interferences and parasitic capacitance between the neighboring wiring structures 600.

The wiring structure 600 may include an interconnection 610 filling up the penetration-hole 301 and contacting (e.g., directly contacting) the drain electrode 230 and the CSL 260. The wiring structure 600 may also include a metal line 620 that fills the trench 401 and is connected with the interconnection in a body. The metal line 620 may extend in the first direction x (e.g, like the trench 401).

For example, the interconnection 610 may include a contact plug filling up the penetration-hole 301 and contacting (e.g., directly contacting) the contact area CA, such as the exposed drain electrode 230 and the CSL 260. The metal line 620 may be connected with the interconnection 610 in a body that may be formed by a single process. That is, the interconnection 610 and the metal line 620 integrally connected to each other in a body by the same process may be provided as the wiring structure 600.

The interconnection 610 and the metal wiring 620 may comprise low-resistive metal. Examples of the low-resistive metal may include tungsten (W), tantalum (Ta), titanium (Ti), aluminum (Al), and the like. These metals may be used individually or in combinations thereof. A barrier layer may be further positioned between the wiring structure 600 and the spacer 500 for preventing metal diffusion and for improving adherence of the metal line 620 to the spacer 500 and the insulation patterns 300 and 400.

Referring to FIGS. 2A and 2B, in some embodiments, the interconnection 610 may include a drain contact plug 612 filling up the drain penetration-hole 301a and contacting (e.g., directly contacting) the drain electrode 230, and may include a source contact plug 614 filling up the source penetration-hole 301b and contacting (e.g., directly contacting) the CSL 260. In addition, the metal line 620 may include a bit line 622 making contact (e.g., direct contact) with the drain contact plug 612 and a source line 624 making contact (e.g., direct contact) with the source contact plug 614. Although some embodiments disclose the contact plug 612 as the interconnection 610, any other conductive interconnectors known to any one of the ordinary skill in the art may also be used as the interconnection 610. For example, the interconnection 610 may also include a contact pad and a lower structure of a multilayered wiring structure.

A plurality of the drain contact plugs 612 arranged in series along the first direction x may be simultaneously exposed through the line-shaped drain trench 401a, and the bit line 622 in the drain trench 401a may be simultaneously connected to the plurality of drain contact plugs 612 in a body. Therefore, a drain signal may be simultaneously applied to the plurality of drain contact plugs 612 through the bit line 622 extending in the first direction x.

In addition, a plurality of the source contact plugs 614, which may be arranged in series along the first direction x at every pair of the word lines 250, may be simultaneously exposed through the line-shaped source trench 401b, and the source line 624 in the source trench 401b may be simultaneously connected to the plurality of source contact plugs 614 in a body. Therefore, a source signal may be simultaneously applied to the plurality of the source contact plugs 614 through the source line 624 extending in the first direction. Since the CSL 260 may be commonly connected to the plurality of the source electrodes 220 of the memory cells of the pair of the word lines 250, the source signal may be simultaneously applied to the source electrodes 220 of the pair of the word lines 250.

In some embodiments, the bit line 622 and the source line 624 may be arranged along an upper surface of the second insulation pattern 400 and thus may have substantially the same height (e.g., top surfaces of the bit line 622 and the source line 624 may be substantially coplanar). Alternatively, the bit line 622 and the source line 624 may have different heights (e.g., may have non-coplanar top surfaces), as would be known to one of ordinary skill in the art. For example, a third insulation pattern may be further provided between the first and second insulation patterns 300 and 400, and the source trench 401b that is connected/continuous with the source penetration-hole 301b of the first insulation pattern 300 may be arranged in the third insulation pattern in place of the second insulation pattern 400. In such a case, the source line 624 may be positioned in the third insulation pattern while the bit line 622 is positioned in the second insulation pattern 400. Accordingly, the source line 624 may extend in various directions in accordance with process conditions and device requirements, irrespective of the bit lines 622.

Although a signal line such as the bit line 622 and the source line 624 for transferring signals to memory cells of the semiconductor device 1000 may be disclosed in some embodiments as the metal line 620, any other conductive lines known to one of the ordinary skill in the art may be used as the metal line 620. For example, other conductive lines may be used and may be enclosed with the spacer 500 and connected to the interconnection in a body. In one example, the metal line 620 may include a power line for applying an electric power to driving circuits at a peripheral region of the substrate 100 and a ground line for electrically grounding the signal line and the power line.

According to some embodiments of the semiconductor device 1000, the interconnection 610 may be integrally connected to the metal wiring/line 620 in a body, and thus a planarization process for forming the interconnection 610 may not be needed when forming the wiring structure 600 for the semiconductor device 1000. Therefore, residuals of the conductive materials, such as the residuals of the barrier layer, may be reduced/prevented between the interconnection 610 and the metal wiring/line 620, thereby reducing/preventing bridge defects of the wiring structure 600 due to the residuals of the conductive materials. In addition, the interconnection 610 may not be damaged by the slurry for a chemical mechanical polishing (CMP) process because the interconnection 610 is formed integrally with the metal wiring/line 620 and the CMP process for forming the interconnection 610 may not be needed. Further, because the metal wiring/line 620 may be enclosed with the insulative spacer 500, neighboring wiring structures 600 may be significantly more insulated from each other, thereby reducing/minimizing electric interference and signal interference between the neighboring wiring structures 600 and reducing/preventing time delay of the signals. Accordingly, the signal delay and bridge defects between the neighboring wiring structures 600 may be sufficiently reduced/prevented even though the gap distance between the neighboring wring structures 600 may be decreased due to the downsizing (e.g., increased integration) of the semiconductor device 1000.

FIGS. 4A to 4I are cross-sectional views illustrating a method of manufacturing the semiconductor device shown in FIGS. 1A and 1B according to some embodiments.

Figure 4A:
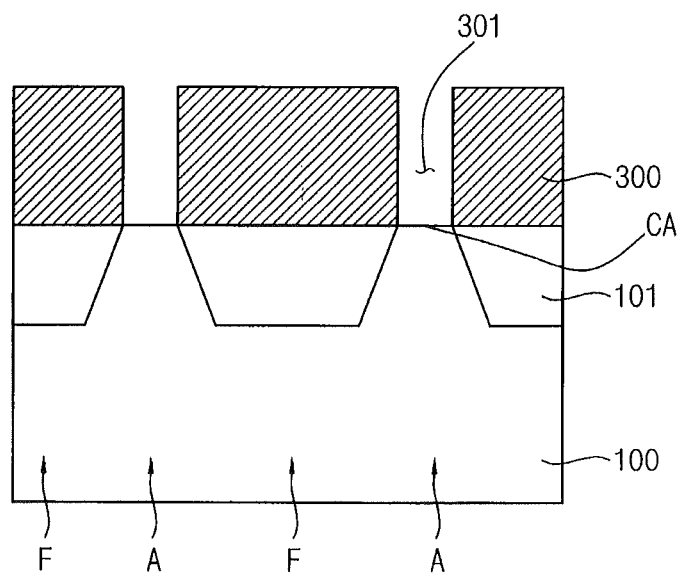

Referring to FIG. 4A, the first insulation pattern 300 may be formed on the substrate 100 including a plurality of the conductive structures 200 on an active region A thereof. The substrate 100 may be divided into the active region A and a field region F defining the active region A, and a device isolation layer 101 may be formed on the field region F of the substrate 100. Thus, the conductive structures 200 on the neighboring active regions A may be electrically insulated from each other by the device isolation layer 101. The penetration-hole 301 may be formed in the first insulation pattern 300, and the contact area CA of the substrate 100 may be exposed through the penetration-hole 301.

The substrate 100 and the conductive structures 200 may have substantially the same configuration as described with reference to FIGS. 1A and 1B, and may be formed by conventional semiconductor manufacturing processes. Thus, any further descriptions for forming the substrate 100 and the conductive structures 200 may be omitted.

A first insulation layer may be formed on the substrate 100 to cover the conductive structures 200. Thus, the conductive structures 200 may be electrically insulated from one another and from the wiring structure 600 that may be formed in a subsequent process. Then, a patterning process may be performed on the first insulation layer, to thereby form the first insulation pattern 300 having the penetration-hole 301 through which the substrate 100 may be partially exposed. The penetration-hole 301 may include the drain penetration-hole 301a and the source penetration-hole 301b.

Particularly, the drain electrodes 230 of each memory cell of the semiconductor device 1000 may be partially exposed through the drain penetration-hole 301a, and the CSL 260 may be partially exposed through the source penetration-hole 301b. The drain and the source penetration-holes 301a and 301b may be formed simultaneously by the same photolithography process using a single mask pattern, or may be formed respectively by the respective photolithography process using a different mask pattern.

A plurality of the drain penetration-holes 301a may be formed into a matrix shape along the first and the second directions, and thus the drain electrodes 230 of the semiconductor device 1000 may be exposed through the drain penetration-holes 301a along the first and second directions x and y. In contrast, the source penetration-hole 301b may be formed between every pair of the word lines 250, and thus the CSL 260 may be partially exposed through the source penetration-holes 301b. A plurality of the source penetration-holes 301b may be arranged in series along the first direction x. Accordingly, some portions of the drain electrodes 230 and the CSL 260 may be provided as the contact area CA in some embodiments. However, any other conductive portions known to one of ordinary skill in the art may also be used as the contact area CA. For example, a lower portion of the multilayered wiring structure 600 may be used as the contact area CA.

Various materials having good (e.g., relatively high) electrical insulative and gap-fill characteristics may be used for the first insulation layer. In some embodiments, the first insulation layer may include an oxide layer or a nitride layer.

Figure 4B:
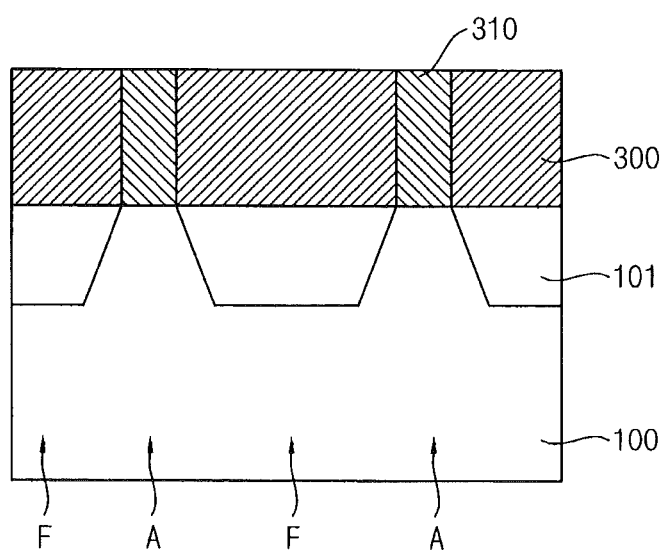

Referring to FIG. 4B, a sacrificial pattern 310 may be formed on the first insulation pattern 300 to a sufficient thickness to fill up the penetration-hole 301. For example, the sacrificial pattern 310 may include a hard mask pattern including a carbon (C)-based material, and thus may be easily removed from the first insulation pattern 300 by a subsequent ashing or strip process.

In some embodiments, a spin-on hard mask layer including carbon (C) may be formed on the first insulation pattern 300 by a deposition process to a sufficient thickness to fill up the penetration-hole 301, and a baking process may be performed for the hard mask layer at a temperature of about 350° C. to about 450° C. Then, an upper portion of the hard mask layer may be removed from the first insulation pattern 300 by a planarization process, until an upper surface of the first insulation pattern 300 is be exposed. Thus, the hard mask layer may remain only/exclusively in the penetration-hole 301, thereby forming the sacrificial pattern 310 filling up the penetration-hole 301.

The planarization process may include an etch-back process and a chemical mechanical polishing (CMP) process. In some embodiments, the hard mask layer may be planarized by an etch-back process, thereby reducing/minimizing the damage caused by slurry for a CMP process.

Therefore, the sacrificial pattern 310 may be formed in the penetration-hole 301 in place of an interconnection of the conventional wiring structure, and thus the planarization process may be performed to the hard mask layer rather than to the conductive layer such as a barrier layer of the conventional wiring structure. Accordingly, the residuals of the barrier layer or other conductive layer may not remain on the first insulation pattern 300, and thus the neighboring interconnections or the wiring structures may be sufficiently protected/prevented from being electrically connected with each other in a medium of the residuals of the barrier layer or the conductive layers.

Figure 4C:
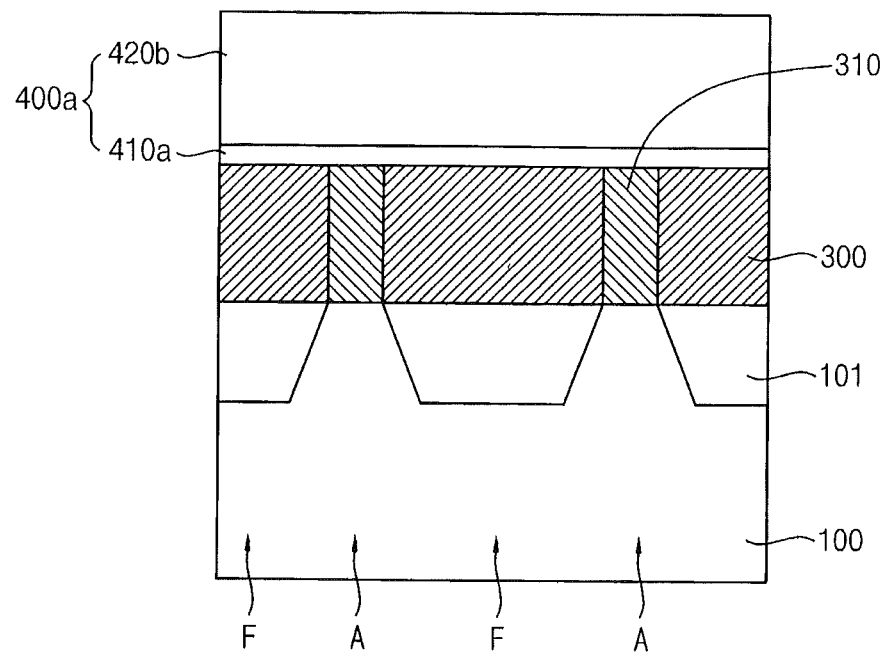

Referring to FIG. 4C, a second insulation layer 400a may be formed on the first insulation pattern 300 and the sacrificial pattern 310. For example, the second insulation layer 400a may include an inter-metal dielectric (IMD) layer 420a for electrically insulating the metal lines and an etch stop layer 410a for stopping an etch process against the IMD layer 420a.

The etch stop layer 410a may comprise a material having an etching selectivity with respect to the IMD layer 420a. For example, the etch stop layer 410a may comprise silicon oxide, silicon nitride, silicon oxynitride, and compositions thereof. Thus, the etching process against the IMD layer 420a may be terminated when the etch stop layer 410a may be exposed. In addition, the first insulation pattern 300 and the sacrificial pattern 310 may be protected from being etched off by the etch stop layer 410a when performing an etching process against the IMD layer 420a.

In some embodiments, the etch stop layer 410a may be formed by a deposition process rather than a sputtering process because the sacrificial pattern 310 may include carbon (C)-based materials. Particularly, the deposition process for forming the etch stop layer 410a may be performed at a temperature of about 350° C. to about 450° C. by using a material including nitrogen (N) and silicon (Si) as a source gas.

The IMD layer 420a may include an oxide layer to which a damascene process for forming the metal wiring/line 620 of FIG. 4I may be easily performed. Particularly, tetra ethyl ortho-silicate may be deposited onto the etch stop layer 410a by a plasma-enhanced chemical vapor deposition (PECVD)

process at a temperature of about 350° C. to about 450° C., to thereby form a PETEOS layer on the etch stop layer 410a as the IMD layer 420a.

Figure 4D:
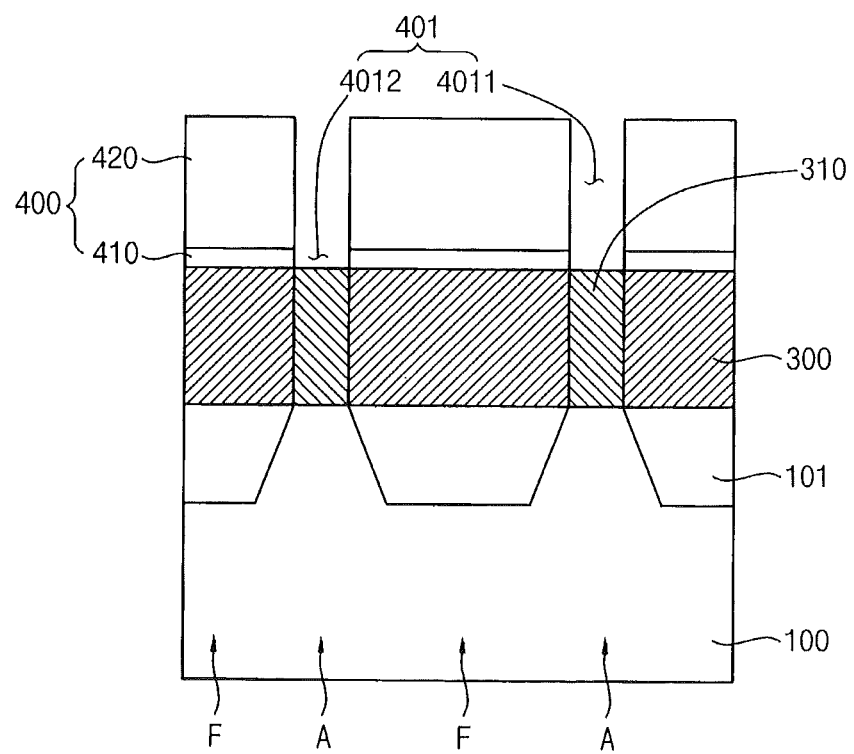

Referring to FIG. 4D, the second insulation layer 400a may be patterned into a second insulation pattern 400 having the line-shaped trench 401 extending in the first direction x.

For example, a mask pattern may be formed on the IMD layer 420a by a photolithography process in such a manner that the IMD layer 420a may be partially exposed through the mask pattern correspondently to the sacrificial pattern 310. Then, the IMD layer 420a may be partially removed from the etch stop layer 410a by an etching process using the mask pattern as an etching mask, thereby forming the IMD pattern 420 having an upper trench 4011 extending in the first direction. Thus, the etch stop layer 410a may be partially exposed through the upper trench 4011 along the first direction. For example, the IMD layer 420a may be removed from the etch stop layer 410a by a dry etching process.

Then, the etch stop layer 410a may be removed from the first insulation pattern 300 including the sacrificial pattern 310 therein, thereby forming the etch stop pattern 410 having a lower trench 4012 that is connected/continuous with the upper trench 4011. For example, the etch stop layer 410a may be removed by a strip process using the IMD pattern 420 as a mask pattern, thereby reducing/minimizing the damage to the IMD pattern 420 when removing the etch stop layer 410a.

Since the lower trench 4012 may also extend in the first direction x, the upper and lower trenches 4011 and 4012 connected/continuous with each other may be formed into a single line-shaped trench 401 extending in the first direction x. Accordingly, the second insulation layer 400a may be formed into the second insulation pattern 400 having the trench 401. That is, the second insulation pattern 400 may include the IMD pattern 420 and the etch stop pattern 410.

Thus, the sacrificial pattern 310 may be exposed through the line-shaped trench 401 in the first direction. In some embodiments, the trench 401 may include a drain trench 401a through which the sacrificial pattern 310 in the drain penetration-hole 301a may be exposed, and a source trench 401b through which the sacrificial pattern 310 in the source penetration-hole 301b may be exposed.

Particularly, a plurality of the drain penetration-holes 301a may extend into the matrix pattern in the first and the second directions x and y, and a plurality of the first directional trenches 401a may be spaced apart by a gap distance in the second direction y. Thus, the sacrificial patterns 310 in the drain penetration-holes 301a that may be arranged in series along the first direction x may be exposed through the same drain trench 401a, and the sacrificial patterns 310 in the drain penetration-holes 301a that may be arranged in series along the second direction y may be exposed through different drain trenches 401a. In addition, because the source penetration-holes 301b may be formed in the first insulation pattern 300 at every pair of the word lines 250 and may be arranged in series in the first direction, the sacrificial pattern 310 exposed through the source penetration-holes 301b may be exposed through the same source trench 401b in the first direction x.

Figure 4E:
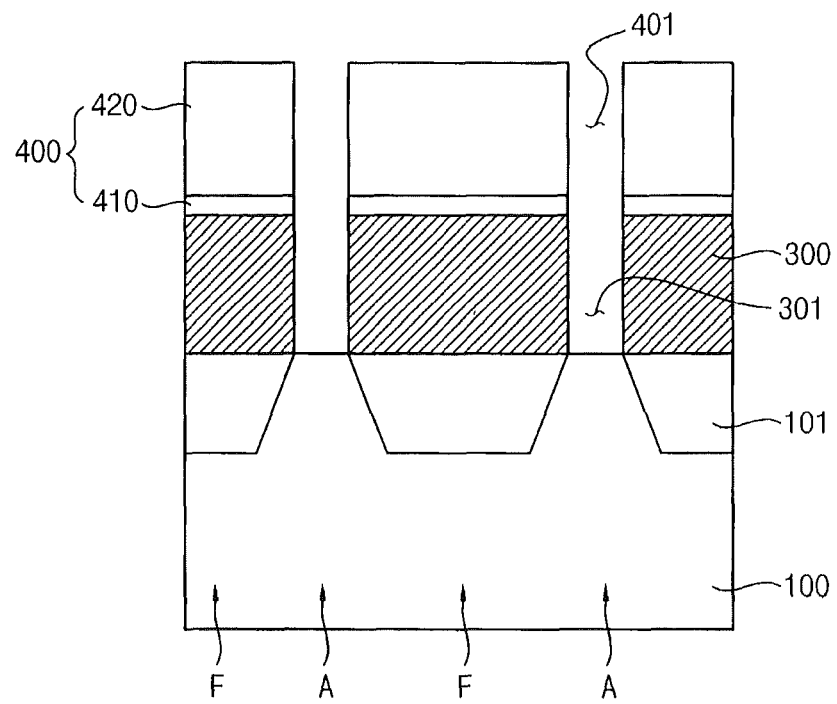

Referring to FIG. 4E, the sacrificial pattern 310 may be removed from the first insulation pattern 300, and thus the penetration-hole 301 and the trench 401 may be connected/continuous with each other, and inner spaces of the penetration-hole 301 and the trench 401 may be formed into a connected/continuous wiring space in which the wiring structure 600 may be formed in a subsequent process. The contact area CA of the substrate 100 may be exposed through the wiring space of the penetration-hole 301 and the trench 401.

Because the sacrificial pattern 310 may comprise carbon (C)-based material, a wet etching process may be used for removing the sacrificial pattern 310 rather than a dry etching process. For example, an ammonium-based etchant, such as low ammonium fluoride liquid (LAL), may be used for the wet etching process. Further, a cleaning process may be optionally performed for removing residuals of the sacrificial pattern 310 from the substrate 100. Accordingly, the drain electrodes 230 and the CSL 260 of the memory cell may be exposed through the penetration-hole 301 at the bottom of the trench 401.

Figure 4F:
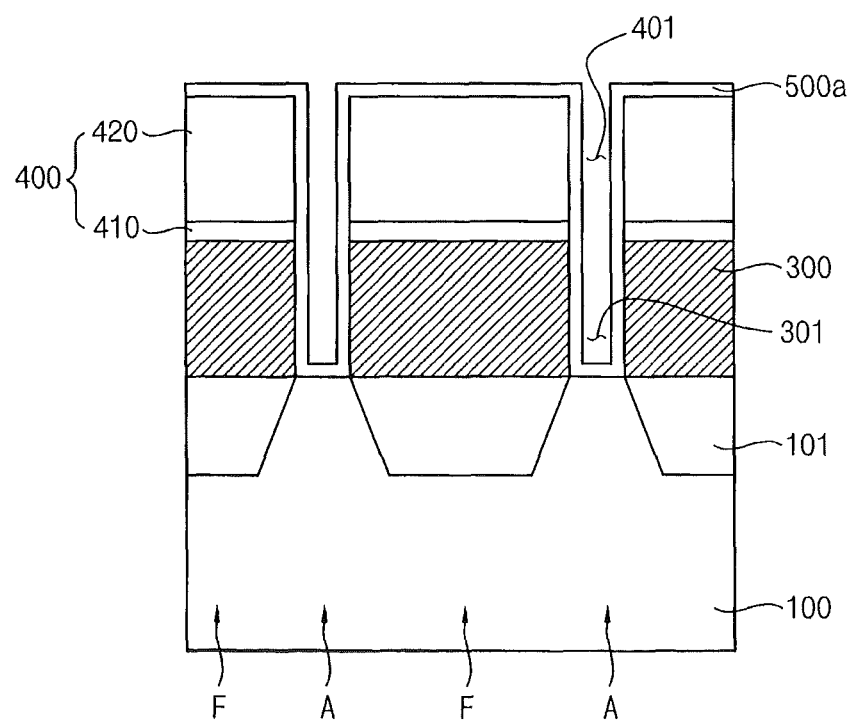

Referring to FIG. 4F, a spacer layer 500a may be formed on the sidewalls and the bottoms of the penetration-holes 301, on the sidewalls of the trenches 401, and on an upper surface of the IMD pattern 420.

In some embodiments, the spacer layer 500a may comprise a material having good step coverage characteristics and thus may be formed on the second insulation pattern 400 according to a surface profile of the penetration-hole 301 and the trench 401. That is, the spacer layer 500a may be formed on the upper surface of the IMD pattern 420, on the sidewalls of the trenches 401 and on the sidewalls and bottoms of the penetration-holes 301. As a result, the inner surfaces of the penetration-holes 301 and the trenches 401 may be covered with the spacer layer 500a.

For example, the spacer layer 500a may comprise a material having good insulative characteristics. Examples of the material(s) having good insulative characteristics may include silicon oxide, silicon nitride, and compositions thereof. Particularly, the penetration-hole 301 may have a diameter equal to or smaller than a width of the trench 401 and have a height corresponding to the thickness of the first insulation pattern 300, to thereby have a high aspect ratio. Thus, the spacer layer 500a may be formed by a plasma-enhanced CVD (PECVD) process or an atomic layer deposition (ALD) process in view of the high aspect ratio of the penetration-hole 301. Accordingly, the inner sidewalls and bottoms of the penetration-hole 301 and the sidewalls of the trench 401 may be substantially/sufficiently covered with the spacer layer 500a despite the high aspect ratio of the penetration-hole 301.

Figure 4G:
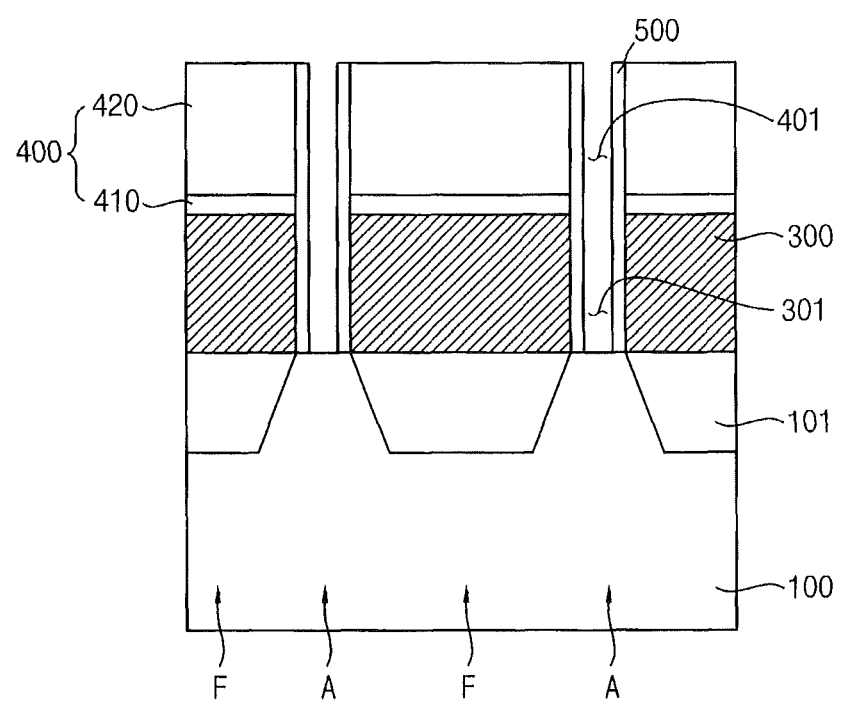

Referring to FIG. 4G, the spacer layer 500a may be partially removed from the first and second insulation patterns 300 and 400, thereby forming the spacer 500 on the sidewalls of the penetration-hole 301 and the trench 401.

In some embodiments, an isotropic etching process may be performed on the spacer layer 500a, and thus the spacer layer 500a on the bottom of the penetration-hole 301 may be removed while the spacer layer 500a on the sidewalls of the penetration-hole 301 and the trench 401 may remain. That is, the spacer layer 500a may be formed into the spacer 500 that only/exclusively covers the sidewalls of the penetration-hole 301 and the trench 401, through a single etching process. Particularly, because the spacer layer 500a on the bottom of the penetration-hole 301 may be removed by the isotropic etching process, the contact area CA of the substrate 100 may also be exposed through the penetration-hole 301. Because the diameter of the penetration-hole 301 and the width of the trench 401 may be reduced by a width of the spacer 500 and thus a size of the wiring space may be reduced by the spacer 500, the width of the spacer 500 may be determined in view of the width of the wiring structure 600. That is, the width of the spacer 500 may be determined in view of the width of the interconnection 610 and the metal line 620 that may be formed in the penetration-hole 301 and the trench 401 in a subsequent process.

Figure 4H:
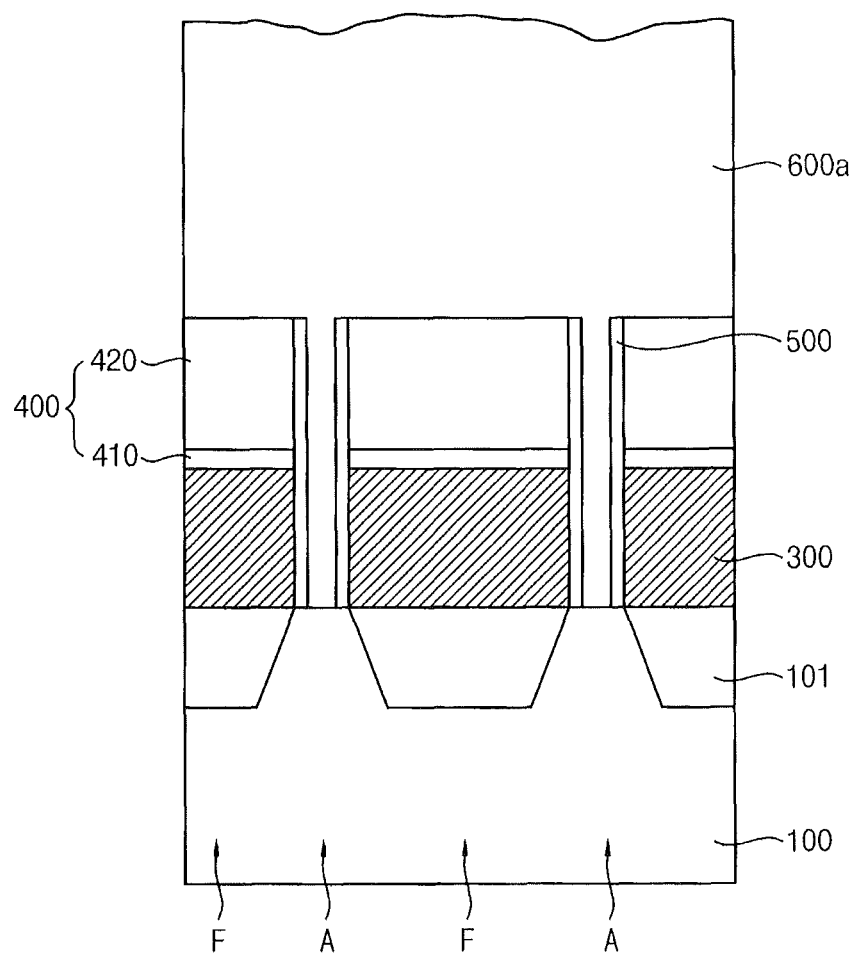
Figure 41:
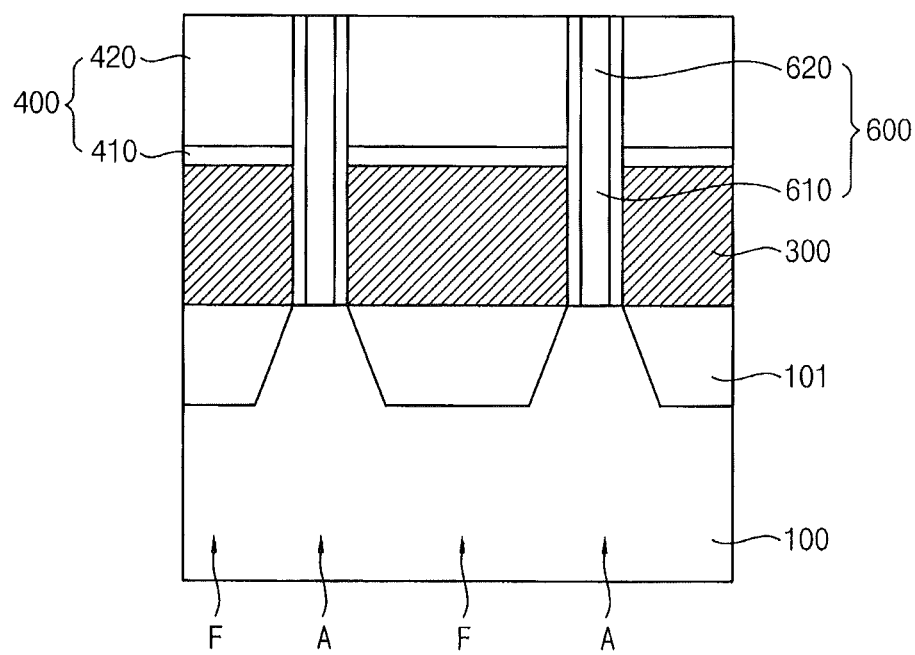

Referring to FIG. 4H, a wiring layer 600a may be formed on the second insulation pattern 400 to a sufficient thickness to fill up the penetration-hole 301 and the trench 401.

For example, a low-resistive metal material may be deposited onto the second insulation pattern 400 in such a manner that the penetration-hole 301 and the trench 401 may be filled up with the metal materials, to thereby form the wiring layer 600a on the second insulation pattern 400. Thus, the contact area CA of the substrate 100 may contact (e.g., directly contact) the wiring layer 600a in the penetration-hole 301. Examples of the low-resistive metal material may include aluminum (Al), tungsten (W), titanium (Ti), tantalum (Ta), and the like. These may be used alone or in combinations thereof. A barrier layer may be further formed on the sidewalls of the penetration-hole 301 and the trench 401, to thereby reduce/prevent the diffusion of the wiring layer 600a.

Referring to FIG. 4I, an upper portion of the metal/wiring layer 600a may be removed from the second insulation pattern 400 by a planarization process until an upper surface of the second insulation pattern 400 is exposed, thereby forming the wiring structure 600 in the penetration-hole 301 and the trench 401.

For example, a CMP process may be performed to the wiring layer 600a until reaching an upper surface of the IMD pattern 420 such that the wiring layer 600a may remain only/exclusively in the penetration-hole 301 and the trench 401, thereby forming the metal structure 600. The metal structure 600 may include the interconnection 610 filling up the penetration-hole 301 and the metal line/wiring 620 filling up the trench 401. Because the trench 401 may extend in the first direction x and a plurality of the trenches 401 may be arranged spaced apart by a gap distance in the second direction y, the metal line/wiring 620 may also extend in the first direction x and a plurality of the metal lines/wirings 620 may also be arranged spaced apart by the same gap distance in the second direction y.

In some embodiments, the interconnection 610 in the drain penetration-hole 301a may function as a drain contact plug 612 that contacts (e.g., directly contacts) the drain electrodes 230 of the memory cell, and the metal line/wiring 620 in the drain trench 401a may function as a bit line 622 of the semiconductor device 1000. Thus, a plurality of the drain contact plugs 612 arranged in series along the first direction x may make simultaneous contact with the bit line 622 extending in the first direction x. In addition, the interconnection 610 in the source penetration-hole 301b may function as a source contact plug 614 making contact (e.g., direct contact) with the CSL 260, and the metal line 620 in the source trench 401b may function as a source line 624 of the semiconductor device 1000. Thus, a plurality of the source contact plugs 614 arranged in series along the first direction may make simultaneous contact with the source line 624 extending in the first direction.

Accordingly, the interconnection 610 in the penetration-hole 301 and the metal line 620 in the trench 401 may be simultaneously formed on the substrate 100 by the same process, and the planarization process for forming the interconnection 610 may be omitted as compared with the conventional manufacturing process for semiconductor devices. Thus, no residuals of conductive materials may remain on an insulation interlayer pattern and neighboring wiring structures 600 may be sufficiently protected/prevented from being electrically connected due to the residuals of the conductive materials. In addition, the spacer 500 may be further provided between the wiring structure 600 and the insulation interlayer pattern, thereby improving electric insulation of the wiring structure 600 and reducing/minimizing signal interferences between the neighboring wiring structures 600. Therefore, the bridge defects and signal interferences between the neighboring wiring structures 600 may be sufficiently reduced/prevented despite the downsizing of the wiring structure 600.

Although some embodiments disclose that the bit line 622 for applying a signal to the drain electrode 230 may be formed simultaneously with the source line 624 for applying a signal to the source electrode 220 in the same process, the bit line 622 and the source line 624 may also be formed individually by a respective process. For example, an additional insulation pattern may be formed on the second insulation pattern 400 and the source line 624 may be formed in the additional insulation pattern.

Thereafter, an insulation interlayer pattern may be formed on the wiring structure 600 and an additional wiring structure such as a signal line and a ground line may be formed on the insulation interlayer pattern. A passivation layer may be further formed on an utmost portion of the resultant structure, thereby forming the semiconductor device 1000.

Some embodiments disclose the wiring structure for a NOR flash memory device. However, any other memory devices may also include the wiring structure to treat bridge defects and signal interferences between neighboring wiring structures (e.g., due to the downsizing of the wiring structure of the memory devices).

According to some embodiments, the interconnection 610 and the metal line/wiring 620 of the wiring structure 600 may be simultaneously formed on the substrate by the same process and thus the planarization process for forming the interconnection 610 may be omitted as compared with the conventional manufacturing process for semiconductor devices. Thus, no residuals of conductive materials may remain on an insulation interlayer pattern, and neighboring wiring structures 600 may be sufficiently protected/prevented from being electrically connected due to the residuals of the conductive materials. In addition, the spacer 500 may be further provided between the wiring structure 600 and the insulation interlayer pattern, thereby improving electrical insulation of the wiring structure 600 and reducing/minimizing signal interferences between neighboring wiring structures 600. Therefore, the bridge defects and signal interferences between neighboring wiring structures 600 may be sufficiently reduced/prevented despite the downsizing of the wiring structure. Accordingly, the semiconductor device 1000 may have high operational reliability despite the high degree of integration.

The semiconductor device 1000 of some embodiments may be applied to various memory system and electronic instruments. For example, the NOR flash memory device including the wring structure may be installed to various electric systems and instruments such as PDA, a portable computer, a mobile phone, a digital player, a memory card, and data receiver/sender, etc.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A method of forming a semiconductor device, comprising:
   forming a plurality of conductive structures on a substrate;
   forming a first insulation layer on the plurality of conductive structures, the first insulation layer extending in both a first direction that is parallel to a bottom surface of the substrate and a second direction that is parallel to the bottom surface of the substrate and that is perpendicular to the first direction;

patterning the first insulation layer to form a first insulation pattern that includes a hole that extends through the first insulation pattern in a third direction that is perpendicular to both the first direction and the second direction, the hole exposing the substrate;

forming a sacrificial pattern in the hole, the sacrificial pattern comprising a spin-on hard mask layer including carbon (C);

forming a second insulation pattern on the first insulation pattern and on the sacrificial pattern, the second insulation pattern including a trench therein that extends in the first direction and that extends through the second insulation pattern in the third direction to expose a surface of the sacrificial pattern; and then removing the sacrificial pattern from the first insulation pattern;

forming a spacer on sidewalls of the hole and the trench; and forming a wiring structure between opposing sidewalls of the spacer in the hole and the trench, wherein a width of the trench in the second direction is equal to a width of the hole in the second direction.

2. The method of claim 1, wherein:
removing the sacrificial pattern from the first insulation pattern exposes a surface of a drain electrode; and
the wiring structure directly contacts the drain electrode.

3. The method of claim 1, wherein forming the sacrificial pattern includes:
forming a sacrificial layer on the first insulation pattern to substantially fill the hole; and
removing an upper portion of the sacrificial layer by performing a planarization process until an upper surface of the first insulation pattern is exposed.

4. The method of claim 1,
wherein the wiring structure comprises an interconnection in the hole and a conductive line in the trench, and
wherein forming the wiring structure comprises forming the interconnection and the conductive line by a same process.

5. A method of forming a semiconductor device, comprising:
forming a first insulation pattern on a substrate to cover a plurality of conductive structures thereon, the first insulation pattern including a penetration-hole therein through which a contact area of the substrate is exposed;

forming a sacrificial layer that comprises a spin-on hard mask layer including a carbon (C)-based material in the penetration-hole in the first insulation pattern;

removing an upper portion of the sacrificial layer by performing a planarization process until an upper surface of the first insulation pattern is exposed to convert the sacrificial layer into a sacrificial pattern;

forming a second insulation pattern on the first insulation pattern, the second insulation pattern including a trench therein that is connected with the penetration-hole and shaped into a line;

removing the sacrificial pattern from the penetration-hole to connect the trench with the penetration-hole and expose the contact area; and then forming a spacer on sidewalls of the penetration-hole and the trench; and forming a wiring structure in the penetration-hole and the trench, the wiring structure including an interconnection in the penetration-hole that directly contacts the contact area of the substrate and a conductive line that fills the trench in the first direction and is integrally connected to the interconnection in a body.

6. The method of claim 5, wherein the first insulation pattern extends in both a first direction that is parallel to a bottom surface of the substrate and a second direction that is parallel to the bottom surface of the substrate and that is perpendicular to the first direction, wherein the penetration-hole extends in a third direction that is perpendicular to both the first direction and the second direction, wherein the trench extends in the first direction, and wherein a width of the trench in the second direction is equal to a width of the penetration-hole in the second direction.

7. The method of claim 6, wherein the spacer is formed by forming a spacer layer using an atomic layer deposition (ALD) process and then etching the spacer layer.

* * * * *